United States Patent
Inoue et al.

(10) Patent No.: US 8,558,248 B2
(45) Date of Patent: *Oct. 15, 2013

(54) Al ALLOY FILM, ELECTRONIC DEVICE, AND ACTIVE MATRIX SUBSTRATE FOR USE IN ELECTROOPTIC DISPLAY DEVICE

(75) Inventors: Kazunori Inoue, Tokyo (JP); Nobuaki Ishiga, Kumamoto (JP); Kensuke Nagayama, Kumamoto (JP); Naoki Tsumura, Kumamoto (JP); Takumi Nakahata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 331 days.

This patent is subject to a terminal disclaimer.

(21) Appl. No.: 12/234,371

(22) Filed: Sep. 19, 2008

(65) Prior Publication Data

US 2009/0134407 A1 May 28, 2009

(30) Foreign Application Priority Data

Sep. 19, 2007 (JP) ................................. 2007-241955

(51) Int. Cl.
  *H01L 33/00* (2010.01)
(52) U.S. Cl.
  USPC .................. 257/88; 257/40; 438/34; 313/504
(58) Field of Classification Search
  USPC ............. 257/40, 79, 102, E33.051; 313/504, 313/509; 438/34
  See application file for complete search history.

(56) References Cited

U.S. PATENT DOCUMENTS

| | | | |
|---|---|---|---|
| 5,334,266 A * | 8/1994 | Kawanishi et al. | 148/403 |
| 5,514,909 A | 5/1996 | Yamamoto et al. | |
| 6,114,805 A * | 9/2000 | Codama et al. | 313/509 |
| 6,323,490 B1 * | 11/2001 | Ikeda et al. | 250/370.09 |
| 6,876,144 B2 * | 4/2005 | Peng | 313/504 |
| 7,825,515 B2 * | 11/2010 | Inoue et al. | 257/765 |
| 2002/0068444 A1 * | 6/2002 | Bertrand et al. | 438/648 |
| 2004/0022664 A1 * | 2/2004 | Kubota et al. | 420/550 |
| 2004/0126608 A1 | 7/2004 | Gotoh et al. | |
| 2005/0170211 A1 * | 8/2005 | Fujioka | 428/690 |
| 2006/0189047 A1 * | 8/2006 | Yamazaki et al. | 438/149 |

(Continued)

FOREIGN PATENT DOCUMENTS

| | | |
|---|---|---|
| EP | 0 855 451 | 7/1998 |
| JP | 62-240735 | 10/1987 |

(Continued)

OTHER PUBLICATIONS

Office Action issued Apr. 20, 2011, in China Patent Application No. 200810160924.2 (with English translation).

(Continued)

*Primary Examiner* — Phuc Dang
(74) *Attorney, Agent, or Firm* — Oblon, Spivak, McClelland, Maier & Neustadt, L.L.P.

(57) ABSTRACT

In accordance with one aspect of the present invention, an Al alloy film contains a first additive element composed of Ni, and at least one type of second additive element selected from the group consisting of Group 2A alkaline earth metals and Groups 3B and 4B metalloids in Period 2 or 3 of the periodic table of the elements. Furthermore, the composition ratio of the first additive element is 0.5-5 at %, and the composition ratio of the second additive element is 0.1-3 at %.

20 Claims, 10 Drawing Sheets

(56) References Cited

U.S. PATENT DOCUMENTS

| | | | |
|---|---|---|---|
| 2007/0159565 A1* | 7/2007 | Segawa et al. | 349/38 |
| 2007/0251819 A1* | 11/2007 | Kardokus et al. | 204/298.13 |
| 2007/0278497 A1 | 12/2007 | Kawakami et al. | |
| 2008/0001153 A1 | 1/2008 | Urabe et al. | |
| 2008/0073793 A1 | 3/2008 | Urabe et al. | |
| 2008/0315236 A1* | 12/2008 | Lu et al. | 257/98 |
| 2009/0134393 A1 | 5/2009 | Gotoh et al. | |

FOREIGN PATENT DOCUMENTS

| | | |
|---|---|---|
| JP | 62-240738 A | 10/1987 |
| JP | 07-45555 A | 2/1995 |
| JP | 2003-89864 A | 3/2003 |
| JP | 2004-103695 | 4/2004 |
| JP | 2004-214606 A | 7/2004 |
| JP | 2004-363556 | 12/2004 |
| JP | 2005-171378 | 6/2005 |
| JP | 2005-326815 A | 11/2005 |
| JP | 2005-338812 A | 12/2005 |
| JP | 2006-339666 | 12/2006 |
| JP | 2007-142356 A | 6/2007 |
| JP | 2007-157917 A | 6/2007 |
| JP | 2008-10844 | 1/2008 |
| KR | 2003-0048141 | 6/2003 |
| TW | M318797 | 9/2007 |

OTHER PUBLICATIONS

Office Action issued Sep. 16, 2010, in Korean Patent Application No. 10-2008-0084263 with English translation.

Office Action issued Apr. 20, 2011, in Korean Patent Application No. 10-2008-0084263 (with English-language translation).

Office Action issued Feb. 26, 2013, in Japanese Patent Application No. 2007-241955 with English translation.

Japanese Office Action Issued May 14, 2013 in Patent Application No. 2007-241955 (with English translation of relevant parts).

Office Action issued Jun. 7, 2012 in Taiwanese Patent Application No. 097130651 (with partial English-language translation).

* cited by examiner

BEFORE HEAT TREATMENT
(COMPARATIVE EXAMPLE: Al-2at%Ni)

AFTER HEAT TREATMENT OF 250°C
(COMPARATIVE EXAMPLE: Al-2at%Ni)

ALLOY SPIKE PORTIONS

RELATED ART

BEFORE HEAT TREATMENT
(RELATED ART: Al-2at%Cu)

BEFORE HEAT TREATMENT
(COMPARATIVE EXAMPLE: AL-0.3at%Ni)

ALLOY SPIKE PORTIONS

BEFORE HEAT TREATMENT (PRESENT INVENTION: Al-2at%-1at%Si)

AFTER HEAT TREATMENT OF 250°C (PRESENT INVENTION: Al-2at%-1at%Si)

AFTER HEAT TREATMENT OF 300°C (PRESENT INVENTION: Al-2at%-1at%Si)

ALLOY SPIKE PORTIONS

Al ALLOY FILM, ELECTRONIC DEVICE, AND ACTIVE MATRIX SUBSTRATE FOR USE IN ELECTROOPTIC DISPLAY DEVICE

BACKGROUND OF THE INVENTION

1. Field of the Invention

The present invention relates an Al alloy film, an electronic device, and an active matrix substrate for use in electrooptic display devices. In particular, the present invention relates to an Al alloy film that is used for wiring, an electrode film, and the like (which are collectively called "an electrode film" hereinafter) of an electrooptic display device such as a liquid crystal display device and an organic EL (electroluminescence) display device, and an electronic device such as a semiconductor device and an active matrix substrate for use in electrooptic display devices using such an Al alloy film.

2. Description of the Related Art

An electrooptic display device using a TFT active matrix substrate in which thin film transistors (which are called TFTs hereinafter) are used as the switching elements has been known as one example of semiconductor devices. Electrooptic display devices have increasingly found application as one of alternative flat panel display devices to the CRTs (Cathode Ray Tubes) in products in which the advantageous features of the electrooptic display devices such as low power consumption and low profile are fully exploited.

The electrode film used in such TFT active matrix substrates are required to be electrically connected to a TFT semiconductor layer that is made of a Si film or contains a Si film as the main component, or to a transparent oxide conducting layer (e.g., ITO) used for a pixel electrode film, a terminal pad, and the like. Therefore, the so-called high melting point metal material such as titan (Ti), chromium (Cr), molybdenum (Mo), tantalum (Ta), tungsten (W), and alloys having these metals as the main ingredients has been used as typical electrode film material in the related art. That is because these high melting point metals have almost no interfacial diffusion reaction in the bonding interface with the Si semiconductor film, and have excellent electrical contact characteristics in the bonding interface with the oxide conducting film such as ITO.

However, as flat panel display TVs have been becoming larger and the resolution of compact displays such as the displays of mobile phones has been becoming higher, the need to reduce the electrical resistance of wiring material has arisen. Therefore, the specific resistances of high melting point metal in the related art (typically 12-60 $\mu\Omega\cdot cm$) have no longer been considered to be sufficient. Furthermore, in the case of a reflective display in which images are displayed by using reflected light, the electrode film is required to have high light reflectivity to achieve a brighter display characteristic. However, the reflectivity of high melting point metal in the related art has been typically around 60% and not considered to be sufficiently high. In view of such circumstances, aluminum (Al), which has low specific resistance and high light reflectivity and is easy to make wiring pattern, or Al alloy films composed of alloys containing Al as the main ingredients have become a focus of attention as the electrode film material for display devices.

However, some disadvantages are known to arise when an Al alloy film in the related art is applied to the electrode film of a TFF active matrix substrate like one described above, and thereby the application has been very difficult. That is, Al alloy films in the related art are, firstly, known to have poor heat resistance. For example, when they are heated above 100° C. in the manufacturing process of devices, protrusions called "hillocks" and "whiskers" appear on the film surface and the edge surface. These protrusions may cause defective coverage of the protective insulating film formed in the upper layer, and trigger defects such as reduced pressure resistance and electrical shorts. In addition, when an Al alloy film in the related art is directly bonded to an oxide conducting film such as ITO, diffusion reactions occur in the interface and deteriorate electrical characteristics. Furthermore, the Al alloy film in the related art generally causes strong mutual diffusion reactions in the bonding interface with a Si semiconductor film or a film containing Si as the main ingredient, and deteriorates electrical characteristics. Therefore, when the Al alloy film is to be connected to ITO and Si, the Al alloy film cannot be directly connected to them. Instead, the Al alloy film needs to be connected to them by using above-mentioned high melting point metal interposed therebetween as a barrier layer. As a result, it has raised a problem that the number of processes including a film-forming process and an etching process has increased and productivity has decreased.

Accordingly, some improving methods to overcome the above-mentioned problem by contriving effective elements to be added to Al have been proposed. For example, Japanese Unexamined Patent Application Publication No. 7-45555 (Yamamoto et al.) discloses a technique to suppress the occurrence of hillocks by adding a rare-earth element such as Nd, Gd, and Dy to Al. Japanese Unexamined Patent Application Publication No. 2006-339666 (Goto et al.) discloses a technique to improve the electrical characteristics in the bonding interface with ITO by further adding an element such as Ni, Ag, Zn, and Cu. Japanese Unexamined Patent Application Publication No. 2004-363556 (Ikeda et al.) describes a technique to improve the bonding interfaces with ITO and Si, i.e., semiconductor film, by adding transition metal such as Fe, Co, and Ni to Al.

Incidentally, as flat panel display TVs have been becoming larger and the resolution of compact displays such as the displays of mobile phones has been becoming higher as described above, the need for the improvement of the performance of TFTs as switching elements, let alone for the reduction in the electrical resistance of electrode films, has been also increasing. Therefore, the processing temperature has been required to be reduced in order to minimize the thermal damage to the semiconductor elements constituting TFTs. For example, Japanese Unexamined Patent Application Publication No. 2004-103695 (Nakai et al.) states that the target temperature for accomplishing that purpose is less than 250° C. Alternatively, in reflective display devices or transflective display devices in which organic resin films are used to form reflective pixel electrodes, or in organic resin substrates which are to come into practical use as an alternative to glass substrates to achieve the reduction in both size and weight and to realize curved displays that are believed to become the mainstream in the future, the processing temperature is required to be reduced in order to satisfy the constraint imposed by the heat resistance of those organic resin material. In view of such circumstances, an Al alloy film for which low electrical resistance can be achieved with the processing temperature below 300° C., preferably in the order of 200-250° C. is desired. (For example, Nakai et al. states that it is specifically equal to or less than 10 $\mu\Omega\cdot cm$, and more preferably equal to or less than 6 $\mu\Omega\cdot cm$.)

Furthermore, the reduction in the processing temperature is also preferable in that it suppresses the diffusion reactions in the interfaces between the Al alloy film and the ITO film and the Si film. For example, according to the evaluations conducted by the inventor et al. of the present application in which an Al alloy film having the composition disclosed in Ikeda et al. was directly formed on the source and drain electrodes of TFTs using a Si semiconductor, no mutual diffusion reaction was observed in the interface with Si immediately after the film formation. However, the diffusion reaction had gradually proceeded with the heat treatment (it is maintained for about 30 minutes in the ambient atmosphere or nitrogen gas atmosphere), and it had proceeded to such extent at a temperature above 250° C. that the diffusion reaction could be observed even by an optical microscope or the like. Therefore, the processing temperature is also desired to be lowered to a low temperature below 250° C. for that reason.

However, in the case of the Al alloy films disclosed in Yamamoto et al. and Goto et al., the processing temperature needs to be raised to 300° C. or higher in order to achieve sufficiently low electrical resistance. Furthermore, Nakai et al. also states nothing about specific resistance obtained by low temperature heat treatment below 300° C. Accordingly, there has been a problem that the application of an Al alloy film in the related art to the devices in which a low temperature process need be utilized to obtain high-performance TFTs or to make use of organic resin material is very difficult. Furthermore, an Al alloy film is also required to have high reflectivity in the case where it is used for the reflective electrode film of an electrooptic display device. However, substantially no techniques dealing with the reflection characteristics of Al alloy films having the above-mentioned characteristics has been disclosed.

As described above, an Al alloy film in the related art cannot be directly connected to an ITO film or a Si film, and therefore a barrier layer of high melting point metal needs to be formed therebetween. As a result, there have been a problem that the number of processes including a film-forming process and an etching process has increased and productivity has decreased. Furthermore, when Al alloy films disclosed in Yamamoto et al., Goto et al., and Ikeda et al. are used, it requires heat treatment at or above 300° C. in order to achieve sufficiently low electrical resistance. There is a problem that the reduction in the electrical resistance of electrode films is very difficult when it is applied to devices that require a low temperature process at or below 250° C. in order to alleviate the thermal damage to the semiconductors or to satisfy the constraint imposed by the heat resistance of organic resin films that are used for the reflective electrodes.

SUMMARY OF THE INVENTION

The present invention has been made in view of such circumstances, and one of the objects of the present invention is to provide a low-resistance Al alloy film for use in electrode films that is capable of preventing the interfacial diffusion with ITO and Si and applicable to various electronic devices that require a low temperature process, and an electronic device and an active matrix substrate for use in electrooptic display devices using such an Al alloy film.

In accordance with one aspect of the present invention, an Al alloy film contains a first additive element composed of Ni, and at least one type of second additive element selected from the group consisting of Group 2A alkaline earth metals and Groups 3B and 4B metalloids in Period 2 or 3 of the periodic table of the elements.

In accordance with another aspect of the present invention, an electronic device includes an Al alloy film containing a first additive element composed of Ni, and at least one type of second additive element selected from the group consisting of Group 2A alkaline earth metals and Groups 3B and 4B metalloids in Period 2 or 3 of the periodic table of the elements, and a Si film or a film containing Si as the main ingredient that is directly connected to the Al alloy film, or an oxide conducting film containing oxide as the main ingredient that is directly connected to the Al alloy film.

In accordance with another aspect of the present invention, an active matrix substrate for use in an electrooptic display device includes an Al alloy film formed on the substrate containing a first additive element composed of Ni, and at least one type of second additive element selected from the group consisting of Group 2A alkaline earth metals and Groups 3B and 4B metalloids in Period 2 or 3 of the periodic table of the elements, and a semiconductor layer composed of Si or a film containing Si as the main ingredient that is directly connected to the Al alloy film, and/or an oxide conducting film containing oxide as the main ingredient that is directly connected to the Al alloy film.

The present invention can provide a low-resistance Al alloy film for use in electrode films that is capable of preventing the interfacial diffusion with ITO and Si and applicable to various electronic devices that require a low temperature process, and an electronic device and an active matrix substrate for use in electrooptic display devices using such an Al alloy film.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Embodiments to which the present invention is applicable are explained hereinafter. The following explanations are made only for illustrating the embodiments of present invention, and the present invention is not limited to those embodiments. In the following descriptions and the drawings, some nonessential parts are omitted or simplified as appropriate in order to make the explanations clearer and easier.

The present invention realizes an Al alloy film that has a low specific electrical resistance equal to or less than about 6 $\mu\Omega\cdot cm$ as an electrical characteristic and is capable of preventing interfacial diffusion with an ITO film and a Si film with a low temperature process in the order of 200° C.-250° C. As a result of the examinations by the inventors of the present application, we have found out that these characteristics can be attained by including Ni as a first additive element and at least one type of elements selected from the group consisting of Group 2A alkaline earth metals and Groups 3B and 4B metalloids in Period 2 or 3 of the periodic table of the elements as second additive element(s) as the alloy composition of an Al alloy film in accordance with one aspect of the present invention. The present invention has been made based on these findings.

The addition of Ni to Al can suppress the occurrence of interfacial diffusion with an ITO film and a Si film. The infusion diffusion between the ITO film and the Al film can be evaluated, for example, from contact resistance in the contact interface. In the case of an Al film in the related art that does not contain Ni, when the ITO film is formed in the upper layer such that the ITO film contacts with the Al film, the contact resistance in the interface exceeds 100 M$\Omega$ in terms of the corresponding value for the contact interface area of 1000 $\mu m^2$, and therefore it is considered to be a substantially insulating state. However, the contact resistance is reduced to several hundred Q by merely adding Ni, for example, in the order of 0.2 at % to Al. This is believed to be achieved by the effect of the AlNix (x: numeric value) compounds that are generated by the addition of Ni. That is, the AlNix compounds prevent the formation of insulating aluminum oxide (AlOx) that would be otherwise generated by the oxidation reaction of Al in the interface during the ITO film formation. The addition of Ni by 0.5 at % or more in the composition ratio can further reduce the contact resistance to the order of several dozen $\Omega$, and those values are substantially equal to that in the case where conventional high melting point metal such as titan (Ti), chromium (Cr), molybdenum (Mo), tantalum (Ta), tungsten (W), and alloys having these metals as the main ingredients is used.

Figure 1A:
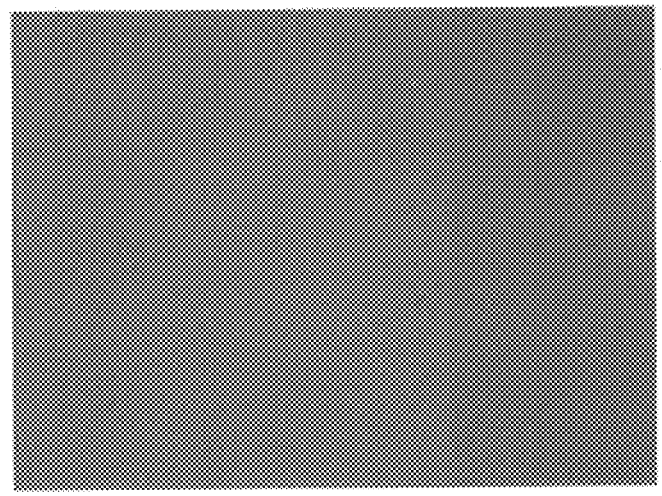
FIG. 1A is a picture for illustrating interfacial diffusion reaction between an Al—Ni film and a Si film.
Figure 1B:
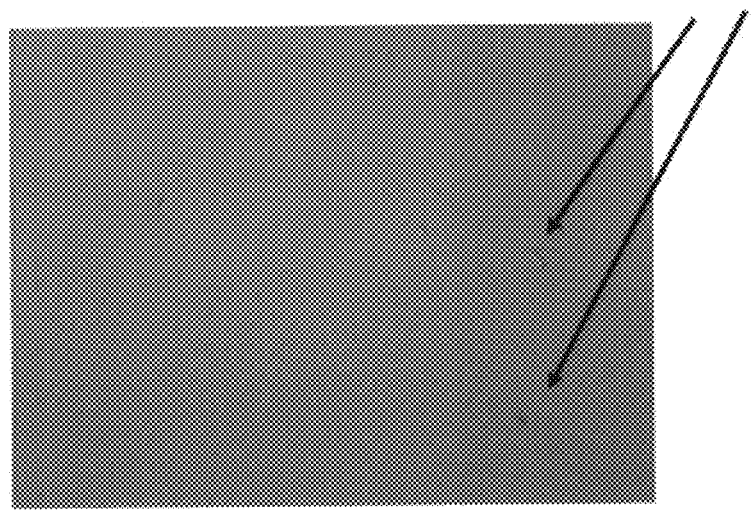
FIG. 1B is a picture for illustrating interfacial diffusion reaction between an Al—Ni film and a Si film.
Figure 2:
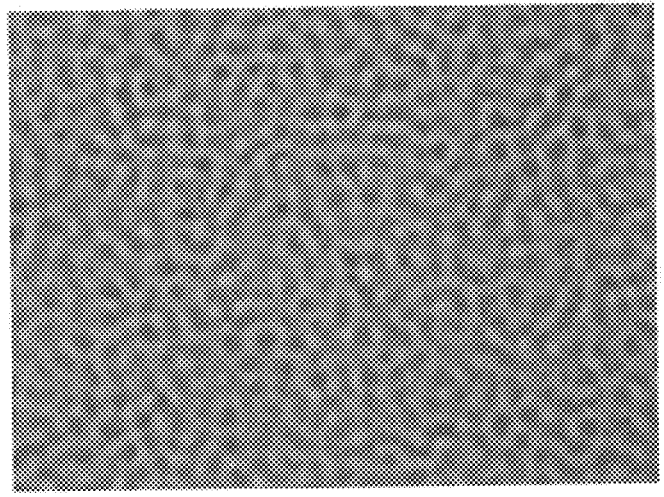
FIG. 2 is a picture for illustrating interfacial diffusion reaction between an Al—Cu film and a Si film in the related art.
Figure 3:
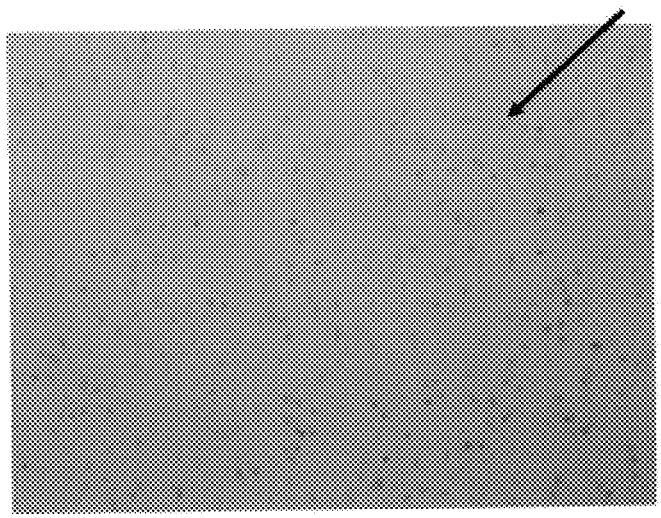
FIG. 3 is a picture for illustrating interfacial diffusion reaction between an Al—Ni film and a Si film of a comparative example.

Interfacial diffusion between the Al film and the Si film can be evaluated by observing interface reactions occurring in the interface (e.g., mutual diffusion reactions called "alloy spikes") with an optical microscope. FIGS. 1A, 1B, 2, and 3 show the results of interfacial diffusion reactions between Al alloy films and Si films evaluated by the inventor et al. of the present application. As the samples, 150 nm of a-Si films and 50 nm of ohmic low-resistance Si films added with Phosphorus were successively formed by CVD (Chemical Vapor Deposition) processes, and then Al alloy films were formed to a thickness of 200 nm by DC magnetron sputtering processes. FIGS. 1A, 2 and 3 shows the film surfaces of the samples observed by an optical microscope immediately after the Al alloy film formations. FIG. 1B shows the result after heat treatment in which the sample was held under the condition of the atmosphere of 250° C. for 30 minutes. FIGS. 1A and 1B show the result of an Al-2 at % Ni film in which Ni was added by 2 at %, FIG. 2 shows the result of an Al alloy film in which no Ni was added (Al-2 at % Cu film in the related art), and FIG. 3 shows the result of an Al—Ni film in which Ni was added by less than 0.5 at % (comparative example: e.g., Al-0.3 at % Ni film).

The Al—Cu film is a well-known Al alloy film that is used to prevent the electro-migration and the stress-migration of Al films in the related art. However, maze-like irregularities were observed throughout the entire film as shown in FIG. 2. The specific electrical resistance that was measured in this state of the Al alloy film was at least one order of magnitude greater than the original specific electrical resistance of the same Al alloy film. Therefore, it is speculated that mutual diffusion reactions occur violently in the interface between Al and Si. Meanwhile, no defectiveness such as irregularities was observed in the case of the Al-2 at % Ni film as shown in FIG. 1A, verifying that the mutual diffusion reactions were suppressed. Incidentally, after the sample including the Al-2 at % Ni film was subjected to heat treatment in which it was held in the atmosphere of 250° C. for 30 minutes, the occurrence of mutual diffusion reactions in spots (alloy spike portions) was observed at parts of the film. Accordingly, although the interfacial diffusion reaction with the Si film is suppressed in the low temperature process of 200-250° C., it has no temperature margin for heat resistance in the case of the Al-2 at % Ni film. As explained later, this temperature margin can be improved by adding second additive element(s).

Furthermore, in the case of the Al—Ni film in which Ni was added by less than 0.5 at % (Al-0.3 at % Ni), the strong mutual diffusion reactions like the ones observed in the Al—Cu film were not observed. However, the occurrence of mutual diffusion reactions in spots was observed at parts of the film. In addition, when the sample including the Al-0.3 at % Ni film was subjected to heat treatment of 250° C. for 30 minutes, the occurrence of hillocks was observed (though which is not shown in the drawings). Such phenomena were hardly observed in the Al alloy film added with Ni by 0.5 at % or more. Therefore, with consideration given to the heat resistance against hillocks and the resistance to interfacial diffusion with the Si film, the composition ratio with which Ni is added to Al should preferably be 0.5 at % or more.

Figure 4:
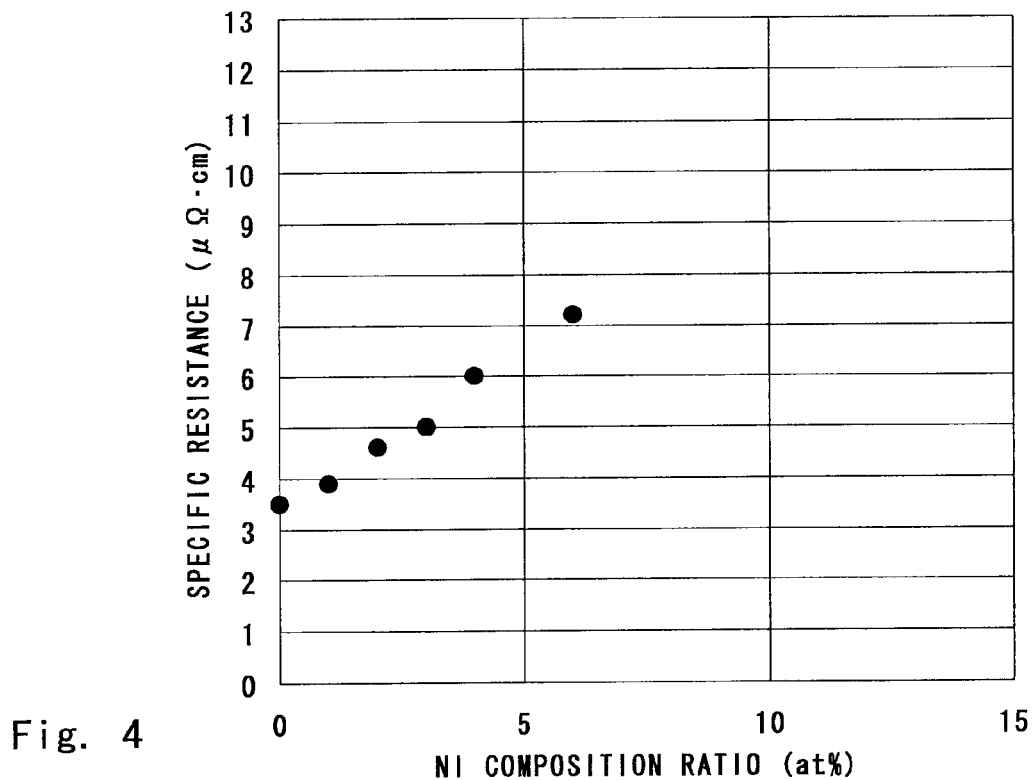
FIG. 4 shows the relation between Ni composition ratio of an Al—Ni film and the specific resistance of the Al alloy film.

The dependence of the specific resistance of Al—Ni alloy films on the Ni composition ratio is explained hereinafter with reference to FIG. 4. FIG. 4 shows the results relating to the dependence of the specific resistance of Al—Ni alloy films on the Ni composition ratio. In FIG. 4, the horizontal axis indicates the Ni composition ratio of an Al—Ni alloy films (at %: atomic percent), and the vertical axis indicates the specific resistance ($\mu\Omega\cdot cm$). It shows values obtained after the samples that were formed into films of about 300 nm in thickness on insulating glass substrates by DC magnetron sputtering processes using Ar gas were subjected to heat treatment in which the samples were held in the atmosphere of sufficiently high temperature, i.e., at 300° C. for 30 minutes. The specific resistance increases steadily with the increase in the Ni composition ratio. As shown in FIG. 4, the Ni composition ratio should preferably be no more than 5 at % in order to prevent the specific resistance of Al alloy films from widely exceeding 6 μΩ·cm.

Figure 5:
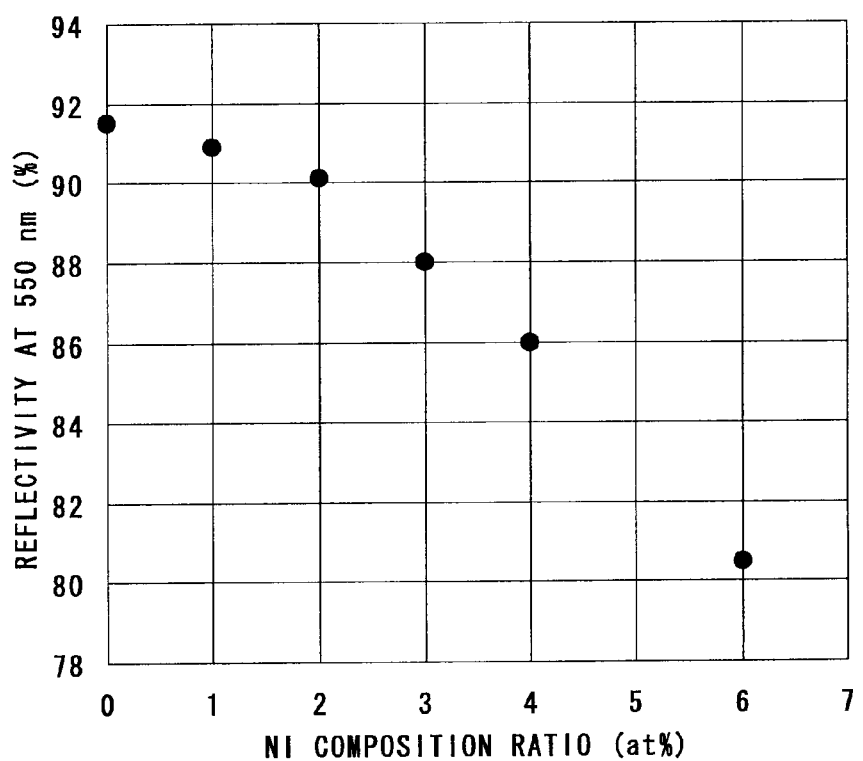
FIG. 5 shows the relation between Ni composition ratio of an Al—Ni film and the reflectivity of the Al alloy film.

FIG. 5 shows the reflectivity, measured at a wavelength of 550 nm, of the same Al—Ni alloy films. As shown in FIG. 5, high reflectivity of 85% or higher can be achieved by decreasing the Ni composition ratio to or below 5 at %. Incidentally, heat treatment of 300° C. or higher, to say the least, needs to be carried out as described above in order to sufficiently lower the specific resistance of Al—Ni alloy films. The reason for this is believed that since AlNix (x: numeric value) compounds are precipitated by the heat treatment, the relative amount of the component that is close to pure Al increases throughout the entire film. In order to precipitate such AlNix compounds in a low temperature heat treatment in order to lower the specific resistance sufficiently, it is necessary to add appropriate second additive element(s) as explained later.

Incidentally, it is appropriate to assume that the specific resistances of metal films, including not only Al films but also any other metal films, typically vary depending on film formation methods, film thicknesses, and measuring methods (persons carrying out measurements) and variations in the measurements. Therefore, although the target specified value for the specific resistance is defined as equal to or less than about 6 μΩ·cm in the above explanations, this value is not the absolute value. Instead, it is considered that the upper limit of the specific resistance should be set to about 8 μΩ·cm or less as the specification.

Figure 6:
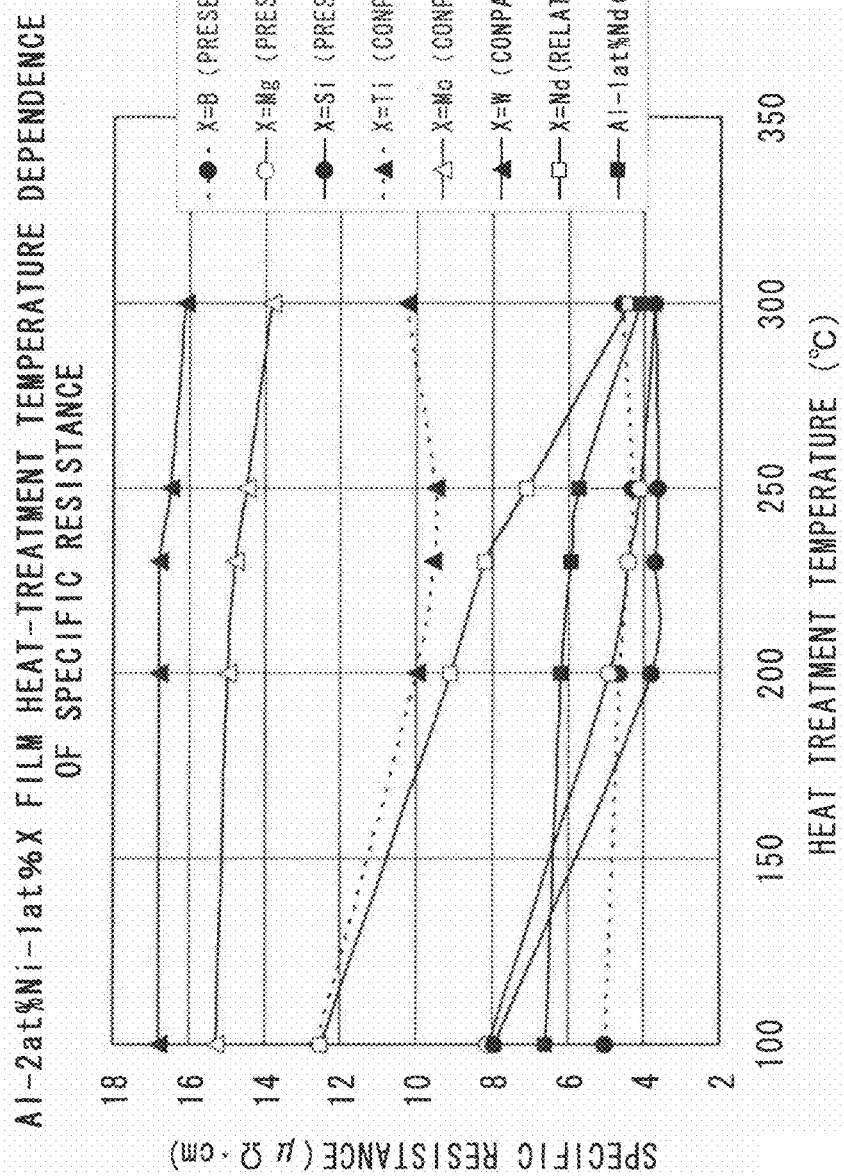
FIG. 6 shows the heat-treatment temperature dependence of the specific resistance of an Al—Ni—X film in accordance with one aspect of the present invention.

The alloy composition of an Al alloy film in accordance with one aspect of the present invention is explained hereinafter with reference to FIG. 6. FIG. 6 shows the heat-treatment temperature dependence of the specific resistances of Al-2 at %-1 at % X films that were prepared by fixing them to Al-2 at % Ni composition and then adding different types of elements Xs in a composition ratio of 1 at % as second additive elements. As described above, one of elements selected from Group 2A alkaline earth metals and Groups 3B and 4B metalloids in Period 2 or 3 of the periodic table of the elements is selected as the second additive element. Incidentally, Ti, Mo, W, and Nd were also added as the elements Xs to prepare comparative examples. Furthermore, the Al-1 at % Nd was prepared as an example of Al-1 at % Nd alloys containing no Ni in the related art.

In the case of X=Nd represents one of the composition components shown in above-mentioned Goto et al. in the related art. As shown in FIG. 6, this type of alloy needs to be heat-treated at a temperature above 270° C. at minimum in order to lower the specific resistance to or below 6 μΩ·cm. Furthermore, the formula Al-1 at % Nd represents one of the composition components shown in above-mentioned Yamamoto et al. in the related art. Although the composition ratio of the additive element is smaller than that of other samples as indicated by the formula Al-1 at % Nd—Ni, the specific resistance still cannot be lowered to or below 6 μΩ·cm with a heat treatment temperature in the order of 200° C. Furthermore, in the cases of X=Ti, Mo, and W, the additions of these elements significantly increase the specific resistances, and thereby the specific resistances cannot be lowered even with a heat treatment temperature of 300° C.

Meanwhile, in the cases of X=B, Mg, and Si, the specific resistances can be lowered to or less than 5 μΩ·cm with a heat treatment temperature of 200° C. Therefore, it can been seen that the present invention can sufficiently lower the specific resistance with a low temperature process at 200-250° C. by adding an element in Group 2A alkaline earth metals and Groups 3B and 4B metalloids in Period 2 or 3 of the periodic table of the elements as a second additive element. In the case of X=Si, the specific resistance of the Al alloy film is lowered to or less than 4 μΩ·cm, and therefore it is particularly preferable.

Figure 7:
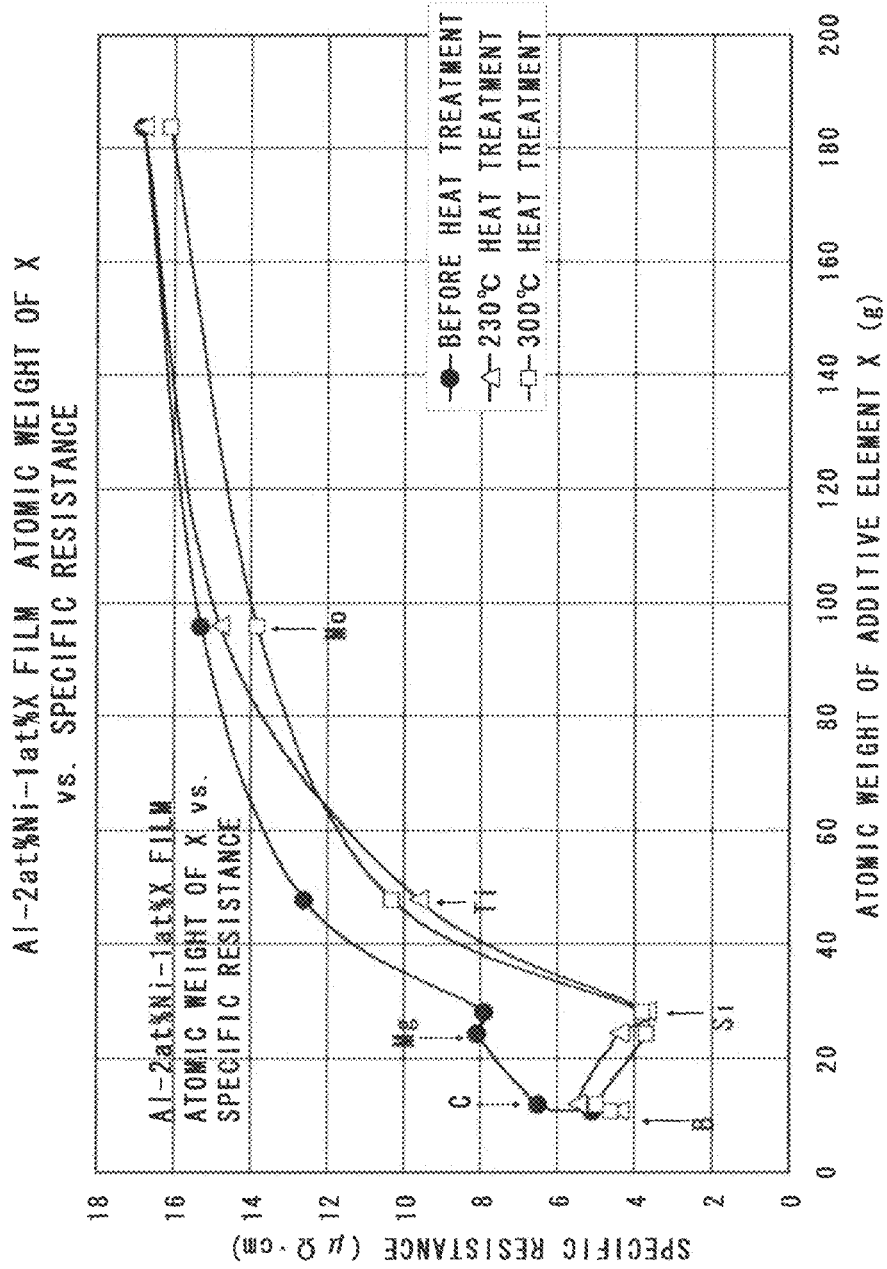
FIG. 7 shows the relation between the atomic weight of the X element and the specific resistance of an Al—Ni—X film in accordance with one aspect of the present invention.

FIG. 7 shows similar results to those of FIG. 6, in which they are plotted in a graph with the horizontal axis indicating the atomic weight of the additive elements Xs. Although there are some exceptions depending on the type of additive elements, the specific resistance of Al alloy films tends to be able to be lowered with the decrease in the atomic weight of the additive elements Xs. Referring to data of the samples that were heat-treated at 230° C. as shown as "Δ" in FIG. 7, the maximum atomic weight with which the specific resistance can be lowered to or less than 6 μΩ·cm is 40 g or less. That applies to elements belonging to up to Period 3 of the periodic table of the elements. Especially, the addition of Mg, which is an alkaline earth metal in Period 3, or Si, which is a Group 4B metalloid in Period 3, is effective in lowering the specific resistance by the heat treatment, and therefore they are considered to be preferable additive elements.

Incidentally, the additions of nonmetals in Groups 5B, 6B, and 7B are not preferable even if they belong to Period 2 or 3, because they increase the specific resistance of Al alloy films. Furthermore, if Li or Na in Group 1A alkaline metals is added, it diffuses into a Si film and acts as mobile ions upon connection to a Si film. Consequently, it significantly deteriorates the semiconductor characteristics of the Si film, and therefore the application of them to electronic devices is not preferable. Accordingly, second additive elements added to Al—Ni are preferably elements in Group 2A alkaline earth metals and Groups 3B and 4B metalloids in Periods 2 and 3 of the periodic table.

As described above, it is believed the specific resistance of Al—Ni alloy films is lowered by heat treatment because AlNix (x: numeric value) compounds are precipitated by the heat treatment and the relative amount of the component that is close to pure Al increases throughout the entire film. These second additive elements Xs in Group 2A alkaline earth metals and Groups 3B and 4B metalloids in Periods 2 and 3 of the periodic table are believed to have an effect of precipitating Al—Ni (or Al—X or Ni—X) compounds with a low heat treatment temperature in the order of 200° C. Therefore, the additions of these second additive elements can precipitate Al—Ni compounds and the likes, and thereby decreasing the specific resistance of Al alloy films. The preferable composition ratio of second additive elements Xs should preferably be 0.1 at % or more at minimum in order to achieve an effective advantageous effect.

Meanwhile, if an Al—Ni—X film containing these second additive elements Xs is to be formed by a sputtering process, the film tends to be deposited in a state where the additive element X or a compound containing it as the main component is precipitated at the early stage of the film formation. At this point, when the etching process is carried out on the film by using a conventional chemical solution containing phosphoric acid and nitric acid as main ingredients, the additive element X or the compound containing it as the main component may remain as an etching residual and cause defective patterning. In order to prevent such defectiveness caused by the etching residual while using the conventional chemical solution instead of using a specially-prepared chemical solution, the composition ratio of the additive element should be preferably no more than 3 at %.

Figure 8A:
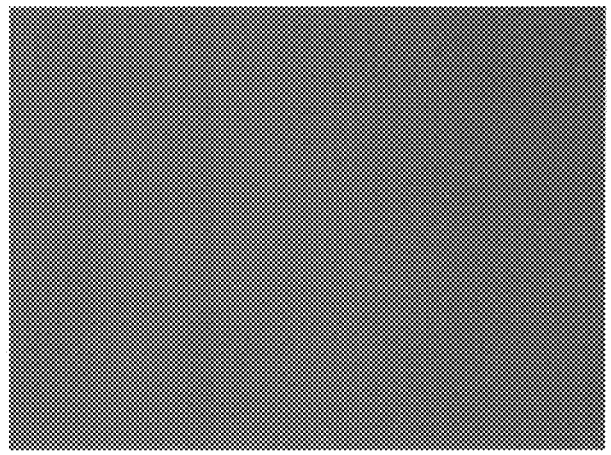
FIG. 8A is a picture for illustrating interfacial diffusion reaction between an Al—Ni—X (X=Si) film and a Si film in accordance with one aspect of the present invention.
Figure 8B:
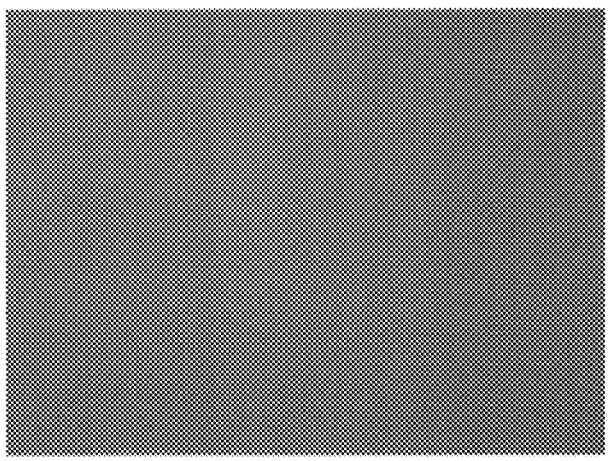
FIG. 8B is a picture for illustrating interfacial diffusion reaction between an Al—Ni—X (X=Si) film and a Si film in accordance with one aspect of the present invention.
Figure 8C:
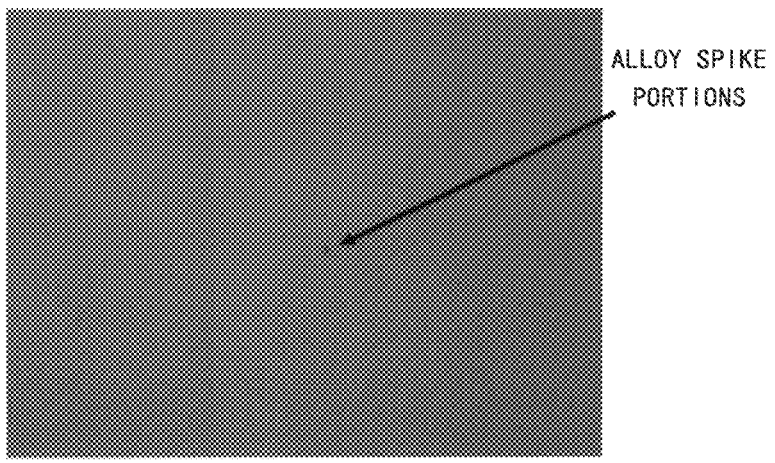
FIG. 8C is a picture for illustrating interfacial diffusion reaction between an Al—Ni—X (X=Si) film and a Si film in accordance with one aspect of the present invention.

FIGS. 8A, 8B, and 8C show the results of interfacial diffusion reactions between Al-2 at % Ni-1 at % Si films and Si films. As shown in FIG. 1B, the occurrence of interfacial diffusion reactions in spots (alloy spike portions) was observed at parts of the surface with the heat treatment temperature of 250° C. in the case of an Al-2 at % Ni film to which no Si was added. However, in the case of an Al-2 at % Ni-1 at % Si film in accordance with one aspect of the present invention, no interfacial diffusion reactions were observed at least with heat treatment at 250° C. as shown in FIG. 8B. Incidentally, the occurrence of interfacial diffusion reactions in spots was observed at parts of the surface with the heat treatment temperature of 300° C. In addition to the case of Si, such tendencies were also observed with above-described other additive elements Xs in Group 2A alkaline earth metals and Groups 3B and 4B metalloids in Periods 2 and 3 of the periodic table. Accordingly, it has been confirmed that the interfacial diffusion with the Si film can be prevented at least in a low temperature process at 200-250° C. by adding an element in Group 2A alkaline earth metals and Groups 3B and 4B metalloids in Period 2 or 3 of the periodic table to the Al—Ni film. Needless to say, the second additive element(s) may be more than one type of elements in addition to or instead of Si. For example, it may be added in combination with element(s) having a similar effect such as Mg unless the total composition ratio exceeds 3 at %.

Embodiments in which the above-mentioned Al alloy films in accordance with one aspect of the present invention are applied to electronic devices are explained hereinafter with reference to the drawings.

First Embodiment

Figure 9:
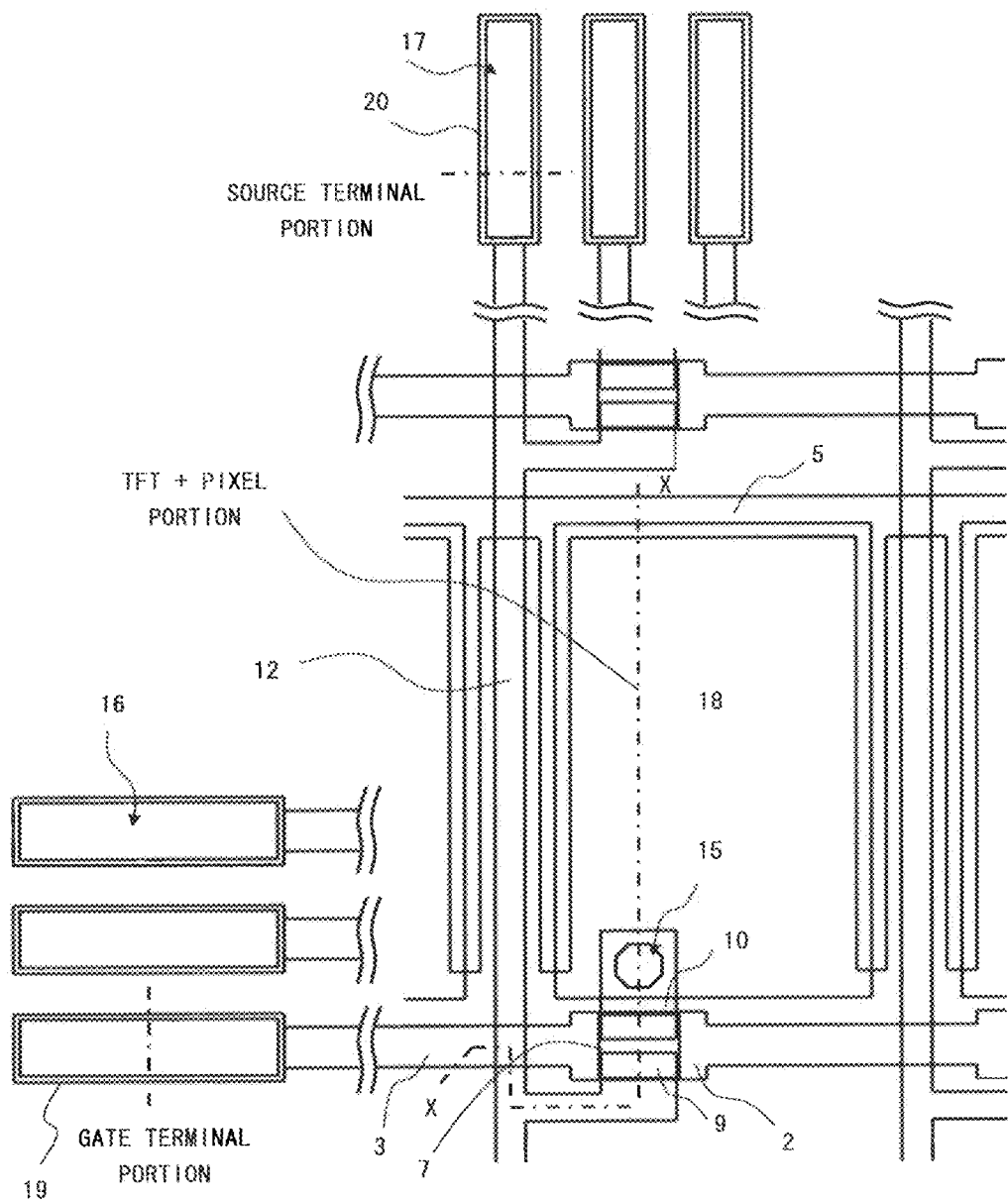
FIG. 9 is a plane view showing the structure of a TFT active matrix substrate for use in an electrooptic display device in accordance with a first embodiment of the present invention.

The structure of an electronic device to which an Al alloy film in accordance with a first embodiment of the present invention is applied is explained hereinafter with reference to FIGS. 9 and 10. In this embodiment, a TFT active matrix substrate for use in a liquid crystal display device using liquid crystals as display elements is explained in detail as an example of electronic devices to which an Al alloy film in accordance with a first embodiment of the present invention is applied. FIG. 9 shows the plane structure of the TFT active matrix substrate in accordance with a first embodiment of the present invention, and FIG. 10 shows the cross-sectional structure of each part of the TFT active matrix substrate taken along the line X-X of FIG. 9.

Figure 10:
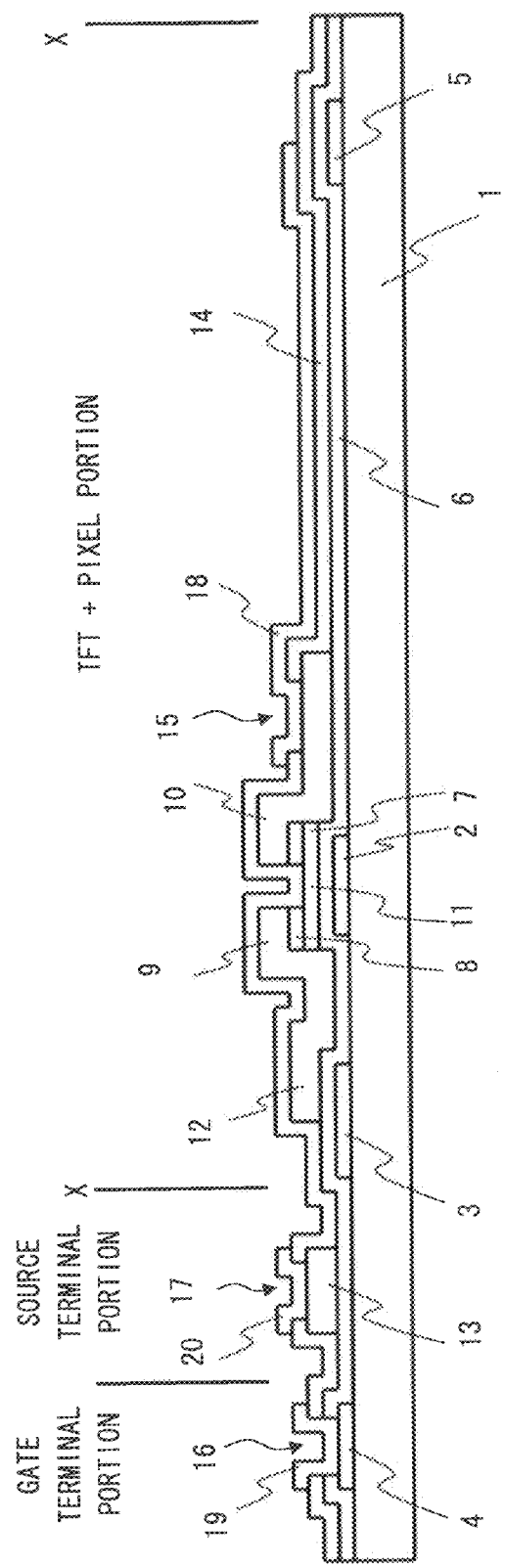
FIG. 10 is a cross section showing the structure of a TFT active matrix substrate for use in an electrooptic display device in accordance with the first embodiment of the present invention.

As shown in FIGS. 9 and 10, the TFT active matrix substrate in accordance with this embodiment includes a transparent insulating substrate 1, gate electrodes 2, gate lines 3, gate terminal portions 4, auxiliary capacitance electrodes 5, a gate insulating film 6, a Si semiconductor film 7, an ohmic low resistance Si film 8, source electrodes 9, drain electrodes 10, channel portions 11, source lines 12, source terminal portions 13, an interlayer insulating film 14, contact holes 15, 16, and 17, transparent pixel electrodes 18, gate terminal pads 19, source terminal pads 20, and the like.

The insulating substrate 1 is composed of glass, plastic, or the like. At least the gate electrodes 2, gate lines 3, gate terminal portions 4, and auxiliary capacitance electrodes 5, all of which are composed of a first metal film, are provided on the insulating substrate 1. The gate lines 3 are connected to the gate electrodes 2. The gate terminal portions 4 are provided to receive scan signals, and connected to gate lines 3.

The gate insulating film 6 is provided above the gate electrodes 2, gate lines 3, gate terminal portions 4, and auxiliary capacitance electrodes 5 so as to cover these components. The Si semiconductor film 7 is provided above the gate insulating film 6 such that its shape corresponds to the gate electrodes 2 located in a lower layer. That is, the Si semiconductor film 7 is formed so as to be opposed to the gate electrodes 2 in the lower layer with the gate insulating film 6 interposed therebetween. The Si semiconductor film 7 becomes a component of the TFT. The ohmic low resistance Si film 8 is provided above the areas of the Si semiconductor film 7 that become the source regions and the drain regions. The ohmic low resistance Si film 8 is composed of Si added with impurities. The source electrodes 9 and the drain electrodes 10, which are composed of a second metal film, are provided on the ohmic low resistance Si film 8. The second metal film is directly connected to that ohmic low resistance Si film 8. Furthermore, the channel portion 11 is formed such that its shape corresponds to the area where the source electrodes 9 and the drain electrodes 10 are separated from each other and the ohmic low resistance Si film 8 is removed.

The source lines 12 are connected to the source electrodes 9. Furthermore, the source terminal portions 13 are connected to the source lines 12. The source terminal portions 13 are provided to receive external video signals. Similarly to the source electrodes 9, both of the source lines 12 and source terminal portions 13 are composed of the second metal film. The interlayer insulating film 14 is formed above the source electrodes 9, the drain electrodes 10, and the likes so as to cover the entire substrate including the channel portions 11. A plurality of openings (contact holes 15, 16, and 17) are formed on the interlayer insulating film 14. The contact holes 15 are pixel drain contact holes that extend to the drain electrodes 10 in the lower layer. Furthermore, the contact holes 16 are gate terminal portion contact holes that extend to the gate terminal portions 4. The contact holes 17 are source terminal portion contact holes that extend to the source terminal portions 13.

The transparent pixel electrodes 18 are connected to the drain electrodes 10 through the pixel drain contact holes 15. The transparent pixel electrodes 18 are composed of an ITO film, which is a transparent oxide conducting film. Furthermore, the gate terminal pads 19 are connected to the gate terminal portions 4 through the gate terminal portion contact holes 16. Furthermore, the source terminal pads 20 are connected to the source terminal portions 13 through the source terminal portion contact holes 17. Both of the gate terminal pads 19 and the source terminal pads 20 are composed of an ITO film.

The semiconductor device, i.e., an optical display device used for a display apparatus is manufactured by sticking a TFT active matrix substrate constructed in the above-mentioned manner and an opposed substrate (not shown), which is equipped with color filters for color display, opposed electrodes, and the like, with a specific gap (cell gap) provided therebetween, and then filling the gap with liquid crystals and sealing the gap.

Al alloy films in accordance with one aspect of the present invention are used for a first metal film and a second metal film in a TFT active matrix substrate for use in an electrooptic display device constructed in the above-mentioned manner. That is, the first metal film and the second metal film are formed of Al alloy containing a first additive element composed of Ni, and at least one type of second additive element selected from the group consisting of Group 2A alkaline earth metals and Groups 3B and 4B metalloids in Period 2 or 3 of the periodic table of the elements. As a preferable example, a semiconductor device used for a display apparatus was manufactured in such a manner that Al-2 at % Ni-1 at % Si films were formed as the first metal film and the second metal film by DC magnetron sputtering processes and the processing temperature was adjusted to or below 250° C. In this example, the specific resistance of the first and second metal films was 3.6 μΩ·cm.

As described above, the gate terminal portions 4 formed from the first metal film are directly connected to the gate terminal pads 19 formed from the ITO film. An Al alloy film in accordance with one aspect of the present invention was used for the first metal film. Therefore, an excellent electrical contact characteristic can be achieved without forming a high melting point metal film as the intermediate film as in the case of the related art.

The under surface of each of the source electrode 9 and the drain electrode 10, both of which are formed from the second metal, is directly connected to the ohmic low resistance Si film 8. Furthermore, the upper surface of the source terminal portions 13 is directly connected to the source terminal pad 20. Furthermore, the upper surface of the drain electrodes 10 is directly connected to the transparent pixel electrode 18 formed from the ITO film. An Al alloy film in accordance with one aspect of the present invention was also used for the second metal film. Therefore, an excellent electrical contact characteristic can be achieved in any of these contact interfaces without forming a high melting point metal film as the intermediate film as in the case of the related art.

Furthermore, since the processing temperature is controlled to a lower temperature of 250° C. or lower, the diffusion reactions in the interfaces between the first and second metal films and the gate insulating film 6, interlayer insulating film 14, ohmic low resistance Si film 8, and the like can be prevented. Furthermore, since lowering the resistances of the gate lines 3 and the source lines 12 can be realized, a semiconductor device for use in display apparatuses having high display quality that is required in large display apparatuses and high resolution display apparatuses can be manufactured with low cost and high productivity.

Second Embodiment

Figure 11:
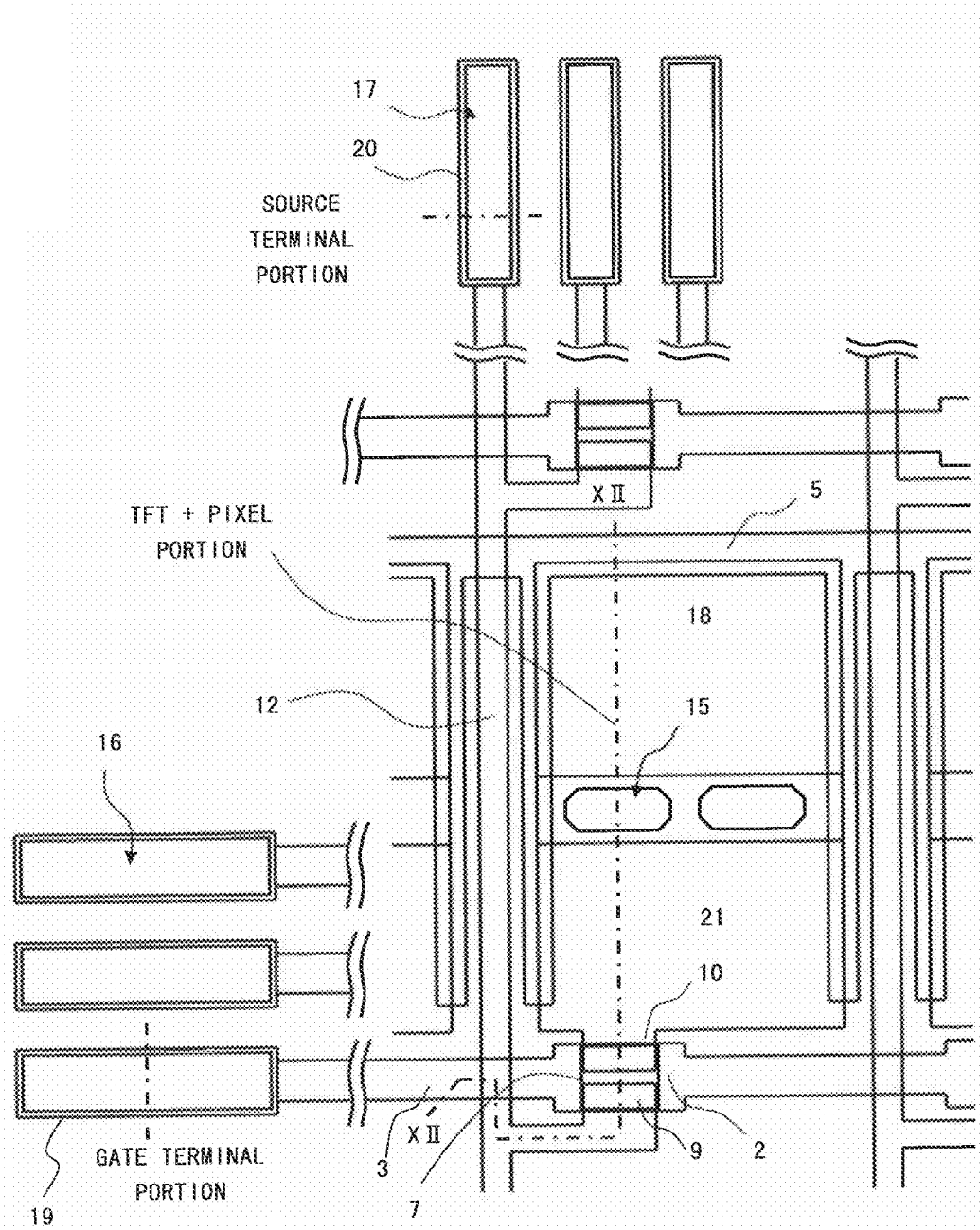
FIG. 11 is a plane view showing the structure of a TFT active matrix substrate for use in an electrooptic display device in accordance with a second embodiment of the present invention.
Figure 12:
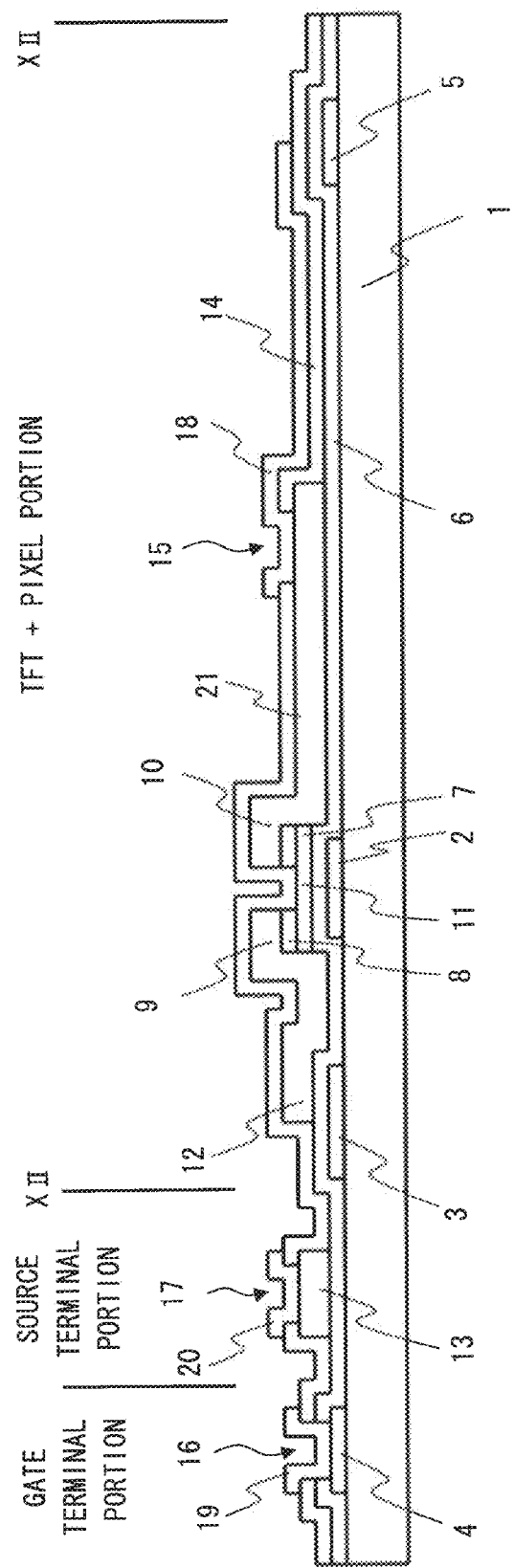
FIG. 12 is a cross section showing the structure of a TFT active matrix substrate for use in an electrooptic display device in accordance with the second embodiment of the present invention.

The structure of an electronic device to which an Al alloy film in accordance with a second embodiment of the present invention is applied is explained hereinafter with reference to FIGS. 11 and 12. FIG. 11 shows the plane structure of the TFT active matrix substrate in accordance with a second embodiment of the present invention, and FIG. 12 shows the cross-sectional structure of each part of the TFT active matrix substrate taken along the line XII-XII of FIG. 11. The TFT active matrix substrate in accordance with this embodiment is different from the first embodiment in that the TFT active matrix substrate of this embodiment is used for a transflective display device or a partially-reflective display device in which portions of the drain electrodes 10 also serves as reflective pixel electrodes 21 that reflect light to display images, while the TFT active matrix substrate of the first embodiment is used for a fully-transmissive display device in which the entire light is transmitted to display images. However, other structures are generally the same as those of the first embodiment. In FIGS. 11 and 12, the same signs are assigned to the same components as those of FIGS. 9 and 10, and explanations of them are omitted as appropriate.

As shown in FIGS. 11 and 12, the TFT active matrix substrate in accordance with this embodiment includes a transparent insulating substrate 1, gate electrodes 2, gate lines 3, gate terminal portions 4, auxiliary capacitance electrodes 5, a gate insulating film 6, a Si semiconductor film 7, an ohmic low resistance Si film 8, source electrodes 9, drain electrodes 10, channel portions 11, source lines 12, source terminal portions 13, an interlayer insulating film 14, contact holes 15, 16, and 17, transparent pixel electrodes 18, gate terminal pads 19, source terminal pads 20, reflective pixel electrodes 21, and the like.

At least the gate electrodes 2, gate lines 3, gate terminal portions 4, and auxiliary capacitance electrodes 5, all of which are composed of a first metal film, are provided on the insulating substrate 1. The gate insulating film 6 is provided above the insulating substrate 1 so as to cover these components. The Si semiconductor film 7 is provided above the gate insulating film 6 such that its shape corresponds to the gate electrodes 2 located in a lower layer, and the ohmic low resistance Si film 8 is provided above the areas of the Si semiconductor film 7 that become the source regions and the drain regions.

The source electrodes 9 and the drain electrodes 10, which are composed of a second metal film, are provided on the ohmic low resistance Si film 8. The second metal film is directly connected to that ohmic low resistance Si film 8. The drain electrodes 10 extend to the pixel regions. The portion of the drain electrode 10 that extends into the pixel region becomes the reflective pixel electrode 21. The source lines 12 are connected to the source electrodes 9, and the terminal portions 13 are connected to the source lines 12. Both of the source lines 12 and the source terminal portions 13 are composed of the second metal film.

The interlayer insulating film 14 is formed above the source electrodes 9, the drain electrodes 10, and the likes so as to cover the entire substrate including the channel portions 11. A plurality of openings (contact holes 15, 16, and 17) are formed on the interlayer insulating film 14. In this embodiment, the contact holes 15 are pixel drain contact holes that extend to the reflective pixel electrodes 21 in the lower layer. Furthermore, the contact holes 16 are gate terminal portion contact holes that extend to the gate terminal portions 4. The contact holes 17 are source terminal portion contact holes that extend to the source terminal portions 13.

The transparent pixel electrodes 18, which are composed of an ITO film, are connected to the reflective pixel electrodes 21 through the contact holes 15. Therefore, the transparent pixel electrodes 18 are connected to the drain electrodes 10 through the reflective pixel electrodes 21. Furthermore, the gate terminal pads 19 are connected to the gate terminal portions 4 through the contact holes 16. Furthermore, the source terminal pads 20 are connected to the source terminal portions 13 through the contact holes 17. Both of the gate terminal pads 19 and the source terminal pads 20 are composed of an ITO film.

An Al alloy film in accordance with one aspect of the present invention is used for a second metal film in a TFT active matrix substrate for use in an electrooptic display device constructed in the above-mentioned manner. That is, the second metal film is formed of Al alloy containing a first additive element composed of Ni, and at least one type of second additive element selected from the group consisting of Group 2A alkaline earth metals and Groups 3B and 4B metalloids in Period 2 or 3 of the periodic table of the elements. As a preferable example, an Al-2 at % Ni-1 at % Si film was formed as the second metal film by a DC magnetron sputtering process and the processing temperature was adjusted to or below 250° C. In this example, the specific resistance of the second metal film was sufficiently low, i.e., 3.6 μΩ·cm, and the light reflectivity at a wavelength of 550 nm was high, i.e., 89.0%.

The under surfaces of the source electrode 9 and the drain electrode 10, which are composed of the second metal film, are directly connected to the ohmic low resistance Si film 8. Furthermore, the source terminal portions 13 are directly connected to the source terminal pads 20. Furthermore, the upper surface of the reflective pixel electrode 21 is directly connected to the transparent pixel electrode 18 formed from the ITO film. Since an Al alloy film in accordance with one aspect of the present invention was used for the second metal film, an excellent electrical contact characteristic can be achieved in any of these contact interfaces without forming a high melting point metal film as the intermediate film as in the case of the related art. Therefore, it enables the use of an Al alloy film that has high reflectivity as the reflective film of the reflective pixel electrode 21, which is formed by extending the drain electrode 10, without any additional treatment.

Furthermore, since the processing temperature is controlled to a lower temperature of 250° C. or lower, the diffusion reactions in the interfaces between the second metal film and the gate insulating film 6, interlayer insulating film 14, ohmic low resistance Si film 8, and the like can be prevented. Furthermore, since lowering the resistances of the gate lines 3 and the source lines 12 can be realized, a semiconductor device for use in display apparatuses having high display quality that is required in large display apparatuses and compact high resolution display apparatuses can be manufactured with low cost and high productivity.

As explained above, for semiconductor devices that have at least some structure in which an Al alloy film is directly connected to a Si film or a film containing Si as the main ingredient or an ITO film, the present invention can achieve an excellent contact characteristic between the Al alloy film and the Si film or the like without high melting point metal interposed therebetween, and thereby enables to manufacture such semiconductor devices with low cost and high productivity. Especially, when the present invention is applied to the source and drain electrodes and the source wirings of an active matrix type TFT substrate for use in a display apparatuses, it can reduce the wiring resistances and form TFT elements having excellent characteristics substantially from Al alloy films alone.

Incidentally, although the semiconductor devices for use in display apparatuses are explained as examples in the above-described embodiments, Al alloy films in accordance with the present invention are not limited to those applications, and can be suitably applied to wirings, electrode films, and reflective films of other types of devices.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An electronic device comprising:
   an Al alloy film including a first additive element comprising Ni, and at least one second additive element selected from the group consisting of B, Mg and Si; and
   a Si film or a film containing Si as the main ingredient that is directly contacted with the Al alloy film,
   wherein C is excluded from the Al alloy film.

2. The electronic device according to claim 1, wherein the composition ratio of the first additive element is 0.5-5 at %.

3. The electronic device according to claim 2, wherein the composition ratio of the second additive element is 0.1-3 at %.

4. The electronic device according to claim 1, wherein the composition ratio of the second additive element is 0.1-3 at %.

5. The electronic device according to claim 1, further comprising:
   an oxide conducting film containing oxide as the main ingredient that is directly contacted with the Al alloy film.

6. A method of making an electronic device, the method comprising
   directly contacting a Si film or a film containing Si as the main ingredient with an Al alloy film; and
   producing the electronic device of claim 1.

7. An active matrix substrate for use in an electrooptic display device comprising:
   an Al alloy film including a first additive element comprising Ni, and at least one second additive element selected from the group consisting of B, Mg and Si; and
   a semiconductor layer including Si or a film containing Si as the main ingredient that is directly contacted with the Al alloy film, and/or an oxide conducting film containing oxide as the main ingredient that is directly contacted with the Al alloy film,
   wherein C is excluded from the Al alloy film.

8. The active matrix substrate for use in an electrooptic display device according to claim 7, wherein the Al alloy film is configured to act as a reflective pixel electrode to reflect light so that an image is displayed.

9. The active matrix substrate for use in an electrooptic display device according to claim 8, wherein the composition ratio of the first additive element is 0.5-5 at %.

10. The active matrix substrate for use in an electrooptic display device according to claim 9, wherein the composition ratio of the second additive element is 0.1-3 at %.

11. The active matrix substrate for use in an electrooptic display device according to claim 8, wherein the composition ratio of the second additive element is 0.1-3 at %.

12. The active matrix substrate for use in an electrooptic display device according to claim 7, wherein the composition ratio of the first additive element is 0.5-5 at %.

13. The active matrix substrate for use in an electrooptic display device according to claim 12, wherein the composition ratio of the second additive element is 0.1-3 at %.

14. The active matrix substrate for use in an electrooptic display device according to claim 7, wherein the composition ratio of the second additive element is 0.1-3 at %.

15. The active matrix substrate for use in an electrooptic display device according to claim 7, wherein the oxide conducting film is transparent.

16. A method of making an active matrix substrate, the method comprising
   directly contacting a Si film or a film containing Si as the main ingredient with an Al alloy film; and
   producing the active matrix substrate of claim 7.

17. An electronic device comprising:
   an Al alloy film including a first additive element comprising Ni, and at least one second additive element selected from the group consisting of B, Mg and Si; and
   an oxide conducting film containing oxide as the main ingredient that is directly contacted with the Al alloy film,
   wherein C is excluded from the Al alloy film.

18. The electronic device according to claim 17, wherein the composition ratio of the first additive element is 0.5-5 at %.

19. The electronic device according to claim 18, wherein the composition ratio of the second additive element is 0.1-3 at %.

20. The electronic device according to claim 17, wherein the composition ratio of the second additive element is 0.1-3 at %.

* * * * *